United States Patent
Ooshiro et al.

(10) Patent No.: US 10,458,548 B2
(45) Date of Patent: Oct. 29, 2019

(54) PISTON RING AND METHOD FOR MANUFACTURING SAME

(71) Applicants: NIPPON ITF, INC., Kyoto (JP); Honda Motor Co., Ltd., Tokyo (JP)

(72) Inventors: Takehiko Ooshiro, Kyoto (JP); Koji Miyake, Kyoto (JP); Masanori Tsujioka, Kyoto (JP); Satoshi Yoshida, Saitama (JP)

(73) Assignees: NIPPON ITF, INC., Kyoto (JP); Honda Motor Co., Ltd., Tokyo (JP)

( * ) Notice: Subject to any disclaimer, the term of this patent is extended or adjusted under 35 U.S.C. 154(b) by 117 days.

(21) Appl. No.: 15/751,155

(22) PCT Filed: Aug. 10, 2015

(86) PCT No.: PCT/JP2015/072683
§ 371 (c)(1),
(2) Date: Feb. 7, 2018

(87) PCT Pub. No.: WO2017/026043
PCT Pub. Date: Feb. 16, 2017

(65) Prior Publication Data
US 2018/0238450 A1      Aug. 23, 2018

(51) Int. Cl.
*F16J 9/26*    (2006.01)
*C23C 16/02*   (2006.01)
(Continued)

(52) U.S. Cl.
CPC ............. *F16J 9/26* (2013.01); *C23C 16/029* (2013.01); *C23C 16/0245* (2013.01);
(Continued)

(58) Field of Classification Search
USPC ............ 277/442; 427/249.1, 249.7, 577; 428/212, 408
See application file for complete search history.

(56) References Cited

U.S. PATENT DOCUMENTS

| | | | | |
|---|---|---|---|---|
| 6,312,766 B1* | 11/2001 | Pai | ............... | C23C 14/06 427/249.7 |
| 2001/0031346 A1* | 10/2001 | Iwamura | ............... | C23C 28/046 428/212 |
| 2011/0045208 A1* | 2/2011 | Ohtake | ............... | C23C 16/042 427/577 |

FOREIGN PATENT DOCUMENTS

| | | | |
|---|---|---|---|
| EP | 2851451 | * | 3/2015 |
| JP | 05-202477 | * | 8/1993 |

(Continued)

OTHER PUBLICATIONS

Fujii et al "Influence of DLC coating thickness on tribological characteristics under sliding rolling conditions" Tribology International 44 p. 1289-1295 (Year: 2011).*

(Continued)

*Primary Examiner* — Archene A Turner
(74) *Attorney, Agent, or Firm* — JCIPRNET

(57) ABSTRACT

Provided is a piston ring having excellent low-friction properties and abrasion resistance manufactured without the need for precision control using an ordinary film formation device that does not have a special function. A piston ring obtained by coating an amorphous carbon film on the surface of a ring-shaped substrate, the piston ring being configured so that the amorphous carbon film is formed by CVD, an increase region, in which the ratio $sp^2/sp^3$ of the $sp^2$ bond to the $sp^3$ bond continuously increases from the substrate surface toward the film surface, and a decrease region, in which the ratio $sp^2/sp^3$ continuously decreases, are formed in alternating fashion, a soft film in which the ratio $sp^2/sp^3$ is low and a hard film in which the ratio $sp^2/sp^3$ is high are formed so as to be layered in alternating fashion by continuous variation of the ratio $sp^2/sp^3$ in the boundary between the increase region and the decrease region, and the (Continued)

decrease regions are formed in equal number to or with one region less than the number of increase regions.

14 Claims, 4 Drawing Sheets

(51) Int. Cl.
| | |
|---|---|
| *C23C 16/27* | (2006.01) |
| *C23C 16/455* | (2006.01) |
| *C23C 16/46* | (2006.01) |
| *C23C 16/513* | (2006.01) |
| *C23C 16/26* | (2006.01) |
| *C23C 16/50* | (2006.01) |
| *C23C 16/52* | (2006.01) |
| *C23C 28/04* | (2006.01) |

(52) U.S. Cl.
CPC .......... *C23C 16/0281* (2013.01); *C23C 16/26* (2013.01); *C23C 16/276* (2013.01); *C23C 16/45538* (2013.01); *C23C 16/463* (2013.01); *C23C 16/50* (2013.01); *C23C 16/513* (2013.01); *C23C 16/52* (2013.01); *C23C 28/048* (2013.01)

(56) References Cited

FOREIGN PATENT DOCUMENTS

| | | | |
|---|---|---|---|
| JP | 10-226874 | * | 8/1998 |
| JP | 2008-1951 | * | 1/2008 |
| JP | 2008286354 | | 11/2008 |
| JP | 2012007199 | * | 1/2012 |
| JP | 2012202522 | | 10/2012 |
| JP | 2012527581 | | 11/2012 |
| JP | 2012527583 | | 11/2012 |
| WO | 2014133095 | | 9/2014 |
| WO | 2015045745 | | 4/2015 |
| WO | 2015115601 | | 8/2015 |

OTHER PUBLICATIONS

"Office Action of China Counterpart Application," dated Mar. 27, 2019, with English translation thereof, p. 1-p. 10.

"International Search Report (Form PCT/ISA/210) of PCT/JP2015/072683", dated Oct. 27, 2015, with English translation thereof, pp. 1-4.

\* cited by examiner

PISTON RING AND METHOD FOR MANUFACTURING SAME

CROSS-REFERENCE TO RELATED APPLICATION

This application is a 371 application of the international PCT application serial no. PCT/JP2015/072683, filed on Aug. 10, 2015. The entirety of the abovementioned patent application is hereby incorporated by reference herein and made a part of this specification.

TECHNICAL FIELD

The present invention relates to a piston ring coated with an amorphous carbon film, and a method for manufacturing the same.

BACKGROUND ART

A piston ring sliding inside an engine slides on an inner circumferential surface of a sleeve (cylinder) in accordance with reciprocating motion of a piston which is mounted in a ring groove formed on an outer circumferential surface of the piston. Accordingly, low-friction properties and abrasion resistance are particularly required among sliding characteristics. Therefore, in the related art, an amorphous carbon film (which will hereinafter also be referred to simply as a "carbon film") is formed on a surface of the piston ring such that sliding characteristics are ensured.

In this case, in order to sufficiently exhibit low-friction properties or abrasion resistance described above, there is a need to increase the thickness of a carbon film to a certain degree. However, since amorphous carbon films have strong internal stress, it has not been easy to form one layer of a carbon film to be thick.

Therefore, for example, Patent Document 1 proposes that internal stress is relaxed by layering two kinds of carbon layers that differ in hardness (hard layer and soft layer) in two or more layers and forming a carbon film, and the carbon film is formed to be a thick film having a film thickness of 5.0 μm or greater.

In this case, the performance (low-friction properties and abrasion resistance) of the film in its entirety is improved by appropriately regulating mechanical properties of each of the hard layer and the soft layer and thickening the carbon film. However, due to the different mechanical properties between the hard layer and the soft layer, there is concern that discontinuity of mechanical properties will be caused in an interface of layers and separation will occur between the layers.

In regard to the separation between layers, Patent Document 2 proposes a technology in which interlayer adhesion is improved and occurrence of separation is suppressed. In Patent Document 2, two kinds of layers having compositions different from each other are repetitively formed, and an inclined layer in which the composition continuously changes is formed between the layers, so that adhesion between two kinds of layers is ensured.

REFERENCE LIST

Patent Literature

Patent Literature 1
  Japanese Patent Application Laid-Open (JP-A) No. 2012-202522

Patent Document 2
  Japanese Patent Application Laid-Open (JP-A) No. 2008-286354

SUMMARY

Technical Problem

However, in order to provide an inclined layer as described above, a film forming apparatus having a special function, for example, forming two kinds of layers having compositions different from each other at the same time, is required. Moreover, in order to achieve continuity of mechanical properties in the inclined layer, precise control is required in film forming.

Therefore, there has been a demand for a technology capable of manufacturing and providing a piston ring having excellent low-friction properties and abrasion resistance using an ordinary film forming apparatus having no special function, without requiring precise control.

Solution to Problem

In order to solve the problem described above, the inventor has investigated a method of continuously changing mechanical properties in an interface between layered amorphous carbon films using a film forming apparatus such as an ordinary CVD apparatus having no special function without requiring precise control. As a result, first, it has been conceived that if film forming conditions inside the film forming apparatus can continuously change, an amorphous carbon film in which mechanical properties continuously change can be obtained using an ordinary film forming apparatus.

As an index for specifically realizing that described above, the inventor has focused on an $sp^2/sp^3$ ratio in the amorphous carbon film. That is, the inventor has focused on the following fact. The $sp^2/sp^3$ ratio indicates a ratio of $sp^2$ bonding (graphite structure) and $sp^3$ bonding (diamond structure) which are bonding modes of carbon in an amorphous carbon film. A soft film is formed when the $sp^2/sp^3$ ratio is low. On the other hand, a hard film is formed when the $sp^2/sp^3$ ratio is high.

The inventor has conceived that when the $sp^2/sp^3$ ratio continuously changes in layering such a soft film and a hard film, mechanical properties continuously change on a border between the soft film and the hard film so that interlayer adhesion can be sufficiently ensured. The inventor has investigated a specific film forming method for forming such a carbon film without requiring precise control.

As a result, it has been found that increasing regions in which the $sp^2/sp^3$ ratio continuously increases and decreasing regions in which the $sp^2/sp^3$ ratio continuously decreases can be alternately present from a substrate surface toward a film surface such that the $sp^2/sp^3$ ratio continuously changes even on borders between the increasing regions and the decreasing regions, by a very simple technique of controlling the substrate temperature using an ordinary film forming apparatus when a carbon film is formed through a CVD method.

That is, the decreasing region is a region in which the $sp^2/sp^3$ ratio decreases from a high $sp^2/sp^3$ ratio to low $sp^2/sp^3$ ratio, from the substrate surface toward the film surface. On the other hand, the increasing region is a region in which the $sp^2/sp^3$ ratio increases from a low $sp^2/sp^3$ ratio to a high $sp^2/sp^3$ ratio, from the substrate surface toward the film surface. Therefore, when an increasing region is present in succession to a decreasing region, a part between a middle portion of the decreasing region and a middle portion of the increasing region becomes a part having a low $sp^2/sp^3$ ratio, and a soft film is formed. On the other hand, when a decreasing region is present continuously to an increasing region, a part between a middle portion of the increasing region and a middle portion of the decreasing region becomes a part having a high $sp^2/sp^3$ ratio, and a hard film is formed.

Since an interface between the soft film and the hard film formed as described above is an intermediate portion between the decreasing regions or the increasing regions and the $sp^2/sp^3$ ratio continuously changes, mechanical properties continuously change. In addition, since the $sp^2/sp^3$ ratio continuously changes even on the borders between the increasing regions and the decreasing regions, mechanical properties continuously change even inside the soft film and the hard film.

As a result, since the $sp^2/sp^3$ ratio continuously changes inside each of the films and in the interface thereof in a carbon film in which such a soft film and a hard film are layered, it is possible to prevent occurrence of separation inside the layer and between layers even if an inclined layer is not provided using a film forming apparatus having a special function. In addition, as described above, since internal stress can be relaxed in a carbon film in which the soft film and the hard film are layered, it is possible to thicken the carbon film.

A piston ring in which such a carbon film is formed can exhibit excellent low-friction properties or abrasion resistance with respect to a sleeve (cylinder).

In this case, in order to improve adhesion between a formed carbon film and a substrate, it is desirable that hardness of the carbon film to be formed first approach hardness of the substrate and film properties gradually change to a highly hard film having sufficient abrasion resistance. In order to realize this, a region immediately above the substrate needs to be an increasing region. On the other hand, depending on the purpose, the surface of the carbon film can be an increasing region or a decreasing region. Therefore, in layering the carbon film, the decreasing regions are configured to be equal in number to or one region fewer than the increasing regions.

The carbon film formed on the outermost surface may end with an increasing region or may end with a decreasing region. In consideration of the initial sliding state with respect to a sliding counterpart (cylinder), it is possible to choose hardness of the outermost surface of the amorphous carbon film or a hardness change at the time of initial abrasion.

According to the invention of item 1, the above-described knowledge is perceived from a surface of a piston ring which is a result. That is, there is provided a piston ring in which a surface of a ring-shaped substrate is coated with an amorphous carbon film. The amorphous carbon film is formed using a CVD method. Increasing regions in which an $sp^2/sp^3$ ratio that is a ratio of $sp^2$ bonding to $sp^a$ bonding continuously increases and decreasing regions in which the $sp^2/sp^3$ ratio continuously decreases are alternately formed from the substrate surface toward a film surface, and the $sp^2/sp^3$ ratio continuously changes on borders between the increasing regions and the decreasing regions so that soft films having a low $sp^2/sp^3$ ratio and hard films having a high $sp^2/sp^3$ ratio are formed in an alternately layered manner. The decreasing regions are configured to be equal in number to or one region fewer than the increasing regions.

According to the invention of item 2, in the piston ring according to item 1, hydrogen content in the amorphous carbon film is equal to or more than 5 atom % in a location having the lowest $sp^2/sp^3$ ratio.

In the present invention, as a technique of controlling film properties (hardness) of an amorphous carbon film, it is preferable to employ a technique in which the $sp^2/sp^3$ ratio changes in accordance with an increase and a decrease of the hydrogen content caused due to a film forming temperature. This is because, in the case of an amorphous carbon film, there is an interrelationship between the hydrogen content and film properties and the $sp^2/sp^3$ ratio becomes lower as the hydrogen content increases so that a soft film can be achieved. In the present invention, in order to obtain a soft film of which internal stress can be sufficiently relaxed, it is preferable that the hydrogen content in the carbon film be equal to or more than 5 atom % in a location having the lowest $sp^2/sp^3$ ratio.

According to the invention of item 3, in the piston ring according to item 1 or 2, the amorphous carbon film is formed on an outer circumferential sliding surface and upper and lower surfaces of the substrate.

In consideration of usage circumstances in which the piston ring is used by being mounted in a ring groove formed on the outer circumferential surface of a piston, such an amorphous carbon film does not have to be formed on an inner circumferential surface of the piston ring (substrate). However, it is preferable that the amorphous carbon film be formed on at least the outer circumferential sliding surface and the upper and lower surfaces of the substrate. When the amorphous carbon film is formed on the outer circumferential sliding surface of the substrate, sliding properties with respect to the sleeve can be improved. On the other hand, when the amorphous carbon film is formed on the upper and lower surfaces, low aggressiveness with respect to the piston ring groove can be improved.

In the invention according to items 1 to 3, the $sp^2/sp^3$ ratio is employed as an index when the carbon film is formed. However, in place thereof, an ID/IG ratio may be employed as an index which is obtained by measuring Raman scattering light (Raman spectrum) using a Raman spectrometer.

That is, when Raman scattering light is measured with respect to a carbon film using the Raman spectrometer, a D-peak appears near 1,350 $cm^{-1}$ and a G-peak appears near 1,570 $cm^{-1}$. Here, the D-peak is a peak based on a six-membered ring structure of carbon, and the G-peak is a peak based on double bonding of carbon. It is known that the ID/IG ratio obtained from each of the peak areas ID and IG has a positive interrelationship with the $sp^2/sp^3$ ratio in an amorphous carbon film containing hydrogen, and it is possible to control film properties of the carbon film using the ID/IG ratio in place of the $sp^2/sp^3$ ratio.

Since the ID/IG ratio can be easily obtained by means of Raman scattering light compared to measuring the $sp^2/sp^3$ ratio, when film forming is controlled by controlling the substrate temperature based on the ID/IG ratio, soft films and hard films are layered such that mechanical properties continuously change in the interface, and thus the carbon film can be easily formed as a thick film.

Specifically, when a G-peak position in the Raman spectrum shifts to a high wavenumber, the ID/IG ratio increases and a hard film is formed, and when the G-peak position shifts to a low wavenumber, the ID/IG ratio decreases and a soft film is formed. Therefore, when a carbon film is formed employing an ordinary film forming apparatus through the CVD method, the substrate temperature is controlled, and the ID/IG ratio is caused to continuously change. Then, high-wavenumber shift regions in which the G-peak position shifts to a high wavenumber and low-wavenumber shift regions in which the G-peak position shifts to a low wavenumber are alternately present such that the ID/IG ratio continuously changes on the borders. Accordingly, soft films and hard films are alternately layered, and a thick carbon film in which mechanical properties continuously change is formed in the interface. Thus, it is possible to provide a piston ring which exhibits excellent low-friction properties or abrasion resistance with respect to a sleeve (cylinder).

The invention according to items 4 to 6 is derived from that described above. In the invention according to item 4, there is provided a piston ring in which a surface of a ring-shaped substrate is coated with an amorphous carbon film. The amorphous carbon film is formed using a CVD method. An ID/IG ratio that is a ratio of a peak area in a D-peak position to a peak area in a G-peak position of a Raman spectrum continuously changes such that high-wavenumber shift regions in which the G-peak position shifts to a high wavenumber and low-wavenumber shift regions in which the G-peak position shifts to a low wavenumber are alternately formed from the substrate surface toward a film surface, and the ID/IG ratio continuously changes on borders between the high-wavenumber shift regions and the low-wavenumber shift regions so that soft films having a low ID/IG ratio and hard films having a high ID/IG ratio are formed in an alternately layered manner. The low-wavenumber shift regions are configured to be equal in number to or one region fewer than the high-wavenumber shift regions.

According to the invention of item 5, in the piston ring according to item 4, hydrogen content in the amorphous carbon film is equal to or more than 5 atom % in a location having the lowest ID/IG ratio.

In addition, according to the invention of item 6, in the piston ring according to item 4 or 5, the amorphous carbon film is formed on an outer circumferential sliding surface and upper and lower surfaces of the substrate.

Next, according to the invention of item 7, there is provided a method for manufacturing a piston ring, in which the piston ring according to any one of items 1 to 6 is manufactured using a CVD method. The method for manufacturing a piston ring includes forming an amorphous carbon film on a substrate by alternately providing a first step of forming a film under a condition in which a temperature of the substrate rises and a second step of forming a film under a condition in which the temperature of the substrate falls.

As described above, in the present invention, a carbon film can be formed such that soft films and hard films are alternately layered, and mechanical properties can continuously change in the interface between the soft film and the hard film, by employing a very simple technique of controlling the substrate temperature using an ordinary film forming apparatus.

Specifically, when film forming is performed under the condition in which the temperature of the substrate rises, the $sp^2/sp^3$ ratio (ID/IG ratio) can continuously increase. On the other hand, when film forming is performed under the condition in which the temperature of the substrate falls, the $sp^2/sp^3$ ratio (ID/IG ratio) can continuously decrease.

Therefore, when the first step of forming a film under the condition in which the temperature of the substrate rises and the second step of forming a film under the condition in which the temperature of the substrate falls are alternately provided, and when the substrate temperature is controlled, the $sp^2/sp^3$ ratio (ID/IG ratio) cyclically changes in a manner of significant→small→significant→small→and so forth, so that the soft films and the hard films are alternately layered. Moreover, the $sp^2/sp^3$ ratio (ID/IG ratio) can continuously change in the interface. Therefore, it is possible to form a carbon film in which mechanical properties continuously change and the soft films and the hard films adhere and are layered alternately.

According to the invention of item 8, in the method for manufacturing a piston ring according to item 7, the CVD method is performed using a plasma CVD apparatus.

The plasma CVD apparatus is a film forming apparatus which allows plasma to infiltrate into a region between the substrates and has favorable disposition properties even if a plurality of substrates are densely disposed. Therefore, a carbon film is easily formed at the same time on both the outer circumferential sliding surface and the upper and lower surfaces, and productivity can be improved.

According to the invention of item 9, in the method for manufacturing a piston ring according to item 8, the plasma CVD apparatus is a Penning Ionization Gauge (PIG) plasma CVD apparatus.

Since the PIG plasma CVD apparatus is not a self-discharge type, the state of plasma is unlikely to be affected by the surface state of the substrate (workpiece) or the temperature. Therefore, the temperature of the workpiece is easily affected, so that the substrate temperature can be easily controlled.

According to the invention of item 10, in the method for manufacturing a piston ring according to any one of items 7 to 9, the amorphous carbon film having distribution of different $sp^2/sp^3$ ratios is formed with respect to each substrate at the same time by causing each of a plurality of substrates to have a difference in thermal exhaust ability in the CVD method.

When a film is formed by the CVD method, if the temperature distribution is generated within a film forming area in the CVD apparatus, various carbon films can be formed in accordance with the temperature distribution. Therefore, when each of the plurality of substrates is caused to have a difference in thermal exhaust ability, it is possible to form an amorphous carbon film having distribution of different $sp^2/sp^3$ ratios suitable for film properties with respect to each substrate at the same time.

According to the invention of item 11, in the method for manufacturing a piston ring according to any one of items 7 to 9, the amorphous carbon film having distribution of different $sp^2/sp^3$ ratios inside the substrate is formed at the same time by causing the substrate to internally have a difference in thermal exhaust ability in the CVD method.

When the substrate internally has a difference in thermal exhaust ability, it is possible to form an amorphous carbon film having distribution of different $sp^2/sp^3$ ratios suitable for film properties inside the substrate at the same time.

Advantageous Effects of Invention

According to the present invention, it is possible to manufacture and provide a piston ring having excellent low-friction properties and abrasion resistance using an ordinary film forming apparatus having no special function, without requiring precise control.

DESCRIPTION OF THE EMBODIMENTS

Figure 1:
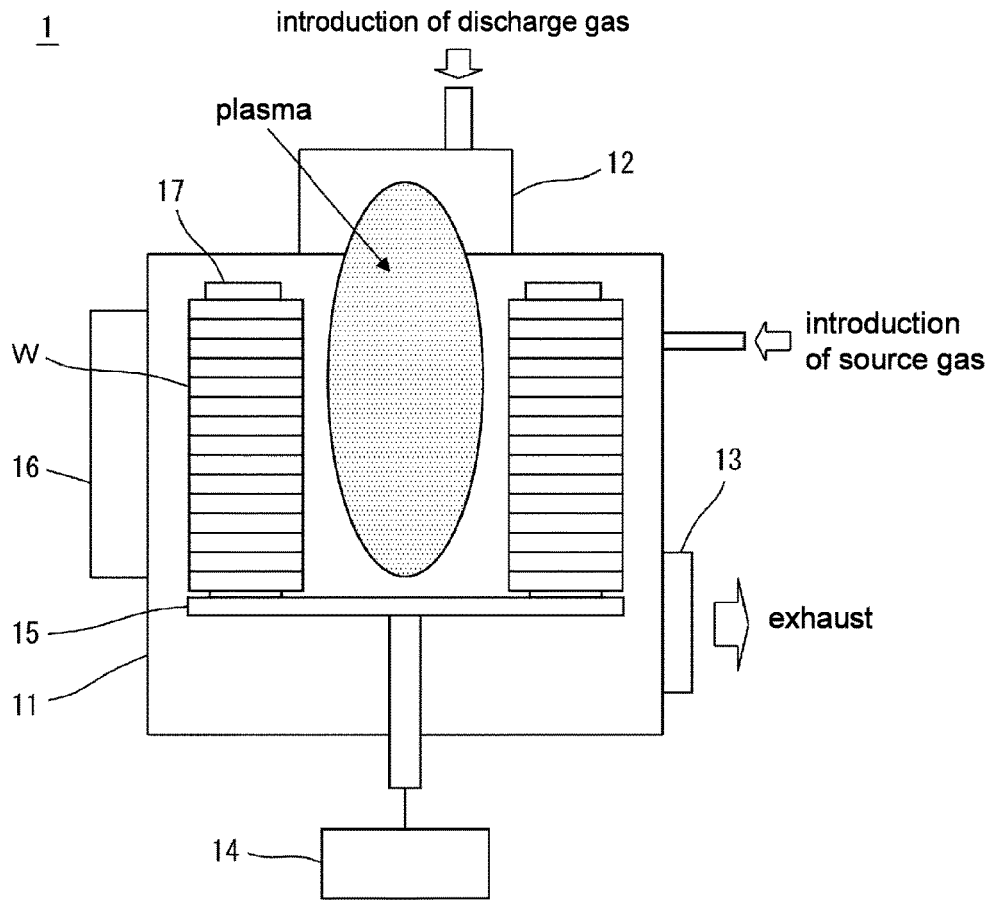
FIG. 1 is a view illustrating an overview of a cathodic PIG plasma CVD apparatus used in a method for manufacturing a piston ring according to an embodiment of the present invention.

Hereinafter, the present invention will be specifically described based on an embodiment.

1. Configuration of Piston Ring

A piston ring according to the present embodiment includes a substrate having a ring shape, and an amorphous carbon film provided on at least an outer circumferential sliding surface and upper and lower surfaces of the substrate. The piston ring is mounted in a ring groove formed on an outer circumferential surface of a piston and slides on an inner circumferential surface of a cylinder in accordance with reciprocating motion of the piston.

(1) Substrate

A piston ring main body which has been used in the related art can be employed as the substrate, and its material is not particularly limited. Examples of the material include a stainless steel material, a casting material, a cast steel material, and a steel material. In addition, its surface may be subjected to nitriding or may be coated with chromium plating or CrN coating.

(2) Amorphous Carbon Film

In the present embodiment, in the amorphous carbon film, while having an $sp^2/sp^3$ ratio that is a ratio of $sp^2$ bonding to $sp^3$ bonding as an index, increasing regions in which the $sp^2/sp^3$ ratio continuously increases and decreasing regions in which the $sp^2/sp^3$ ratio continuously decreases are alternately formed from the substrate surface toward a film surface. Moreover, the $sp^2/sp^3$ ratio also continuously changes on borders between the increasing regions and the decreasing regions. The decreasing regions are configured to be equal in number to or one region fewer than the increasing regions. When the decreasing regions are one region fewer, both the surface of the substrate and the surface of the amorphous carbon film become the increasing regions.

Accordingly, as described above, a soft film is formed in a part having a low $sp^2/sp^3$ ratio. On the other hand, a hard film is formed in a part having a high $sp^2/sp^3$ ratio. Then, the soft films and the hard films are alternately layered. In this case, since the $sp^2/sp^3$ ratio continuously changes from the substrate surface to the film surface, mechanical properties continuously change not only inside the hard films and inside the soft films but also in interfaces of the hard films and the soft films. As a result, it is possible to sufficiently ensure adhesion in the interfaces between the hard films and the soft films and to prevent occurrence of separation in the interfaces. In addition, since soft films and hard films are alternately formed, it is possible to relax internal stress and to easily thicken an amorphous carbon film.

In this case, as described above, the hydrogen content in an amorphous carbon film is preferably equal to or more than 5 atom % in a location having the lowest $sp^2/sp^3$ ratio and more preferably ranges from 5 to 60 atom %.

In forming such a carbon film, as described above, in place of the $sp^2/sp^3$ ratio, an ID/IG ratio obtained by measuring Raman scattering light (Raman spectrum) using a Raman spectrometer can be employed as an index. An increase of the ID/IG ratio and a shift of a G-peak position to a high wavenumber are behaviors of a case in which a decrease of hydrogen and an increase of the $sp^2/sp^3$ ratio occur at the same time, and a decrease of the ID/IG ratio and a shift of the G-peak position to a low wavenumber are behaviors of a case in which an increase of hydrogen and a decrease of the $sp^2/sp^3$ ratio occur at the same time, thereby leading to further limited conditions. However, there are few practical problems.

2. Method for Manufacturing Piston Ring

Next, a method for manufacturing a piston ring according to the present embodiment will be described.

(1) Cathodic PIG Plasma CVD Apparatus

To begin with, a cathodic PIG plasma CVD apparatus used in the present embodiment will be described.

FIG. 1 is a view illustrating an overview of a cathodic PIG plasma CVD apparatus used in the present embodiment. As illustrated in FIG. 1, a cathodic PIG plasma CVD apparatus 1 includes a film forming chamber 11, a plasma chamber 12, an exhaust port 13, a pulsed power supply 14, an electrode 15, a Ti sputtering source 16, and a substrate holding tool 17. The reference sign W indicates a substrate.

A cooling device (not illustrated) for supplying cooling water is provided in the substrate holding tool 17, and a heater (not illustrated) is provided in the film forming chamber 11.

The heater and the cooling device heat and cool the substrate holding tool 17, respectively. Accordingly, the substrate W is indirectly heated and cooled. Here, the heater is configured to be temperature-controllable. On the other hand, the cooling device is configured to have an adjustable speed of supplying the cooling water. Specifically, the cooling device is configured to supply the cooling water to the substrate holding tool 17 when cooling is performed and to stop supplying the cooling water when cooling stops.

(2) Manufacturing Piston Ring

Next, a specific procedure of manufacturing a piston ring (substrate) by forming a carbon film, in which the $sp^2/sp^3$ ratio (ID/IG ratio) continuously changes, on a surface of the piston ring using the cathodic PIG plasma CVD apparatus will be described.

(a) Preparation Before Forming Carbon Film

First, the substrate W subjected to degrease cleansing is set in the substrate holding tool 17 of the cathodic PIG plasma CVD apparatus 1 and is installed inside the film forming chamber 11. The substrate W and the substrate holding tool 17 are electrically connected to the electrode 15, and the pulsed power supply 14 applies a pulse voltage thereto.

Next, the insides of the plasma chamber 12 and the film forming chamber 11 are evacuated through the exhaust port 13 using an exhaust pump (not illustrated). Thereafter, argon (Ar) is introduced into the plasma chamber 12 and the film forming chamber 11 as discharge gas, and the pressure is adjusted. The substrate W is held by the substrate holding tool 17 and revolves inside the film forming chamber 11 while rotating on its axis on the electrode 15 until a series of processing steps of forming a film ends.

Thereafter, Ar plasma is generated by discharging a direct current between a hot filament and an anode (not illustrated) inside the plasma chamber 12. The generated Ar plasma is transported to the inside of the film forming chamber 11. The surface of the substrate W, to which a bias voltage (pulse voltage) is applied by the pulsed power supply 14, is irradiated with Ar ions. Then, cleaning processing is performed by etching.

Next, discharging inside the plasma chamber 12 stops, and sputtering is performed with Ti from the Ti sputtering source 16 under predetermined sputtering conditions. Then, a Ti layer having a thickness ranging from 0.1 to 2.0 μm is formed on the surface of the substrate W.

Next, a Si-containing diamond-like carbon (DLC) layer having a thickness ranging from 0.1 to 3.0 μm is further formed on the formed Ti layer.

Specifically, the process is performed, for example, by supplying hydrocarbon such as acetylene ($C_2H_2$) and methane ($CH_4$); and hydrogen ($H_2$) together with a compound containing Si such as tetramethylsilane (TMS), as source gas in a cathodic PIG plasma CVD method using the cathodic PIG plasma CVD apparatus.

In this manner, a carbon film sufficiently adheres to the substrate surface due to the Ti layer and the Si-containing DLC layer provided as intermediate layers between the substrate surface and the carbon film.

(b) Forming Carbon Film

Next, a carbon film in which the $sp^2/sp^3$ ratio (ID/IG ratio) continuously changes is formed on the Ti layer and the Si-containing DLC layer.

Specifically, the process is performed by alternately providing a first step of forming a film under the condition in which the temperature of the substrate rises and a second step of forming a film in a step in which the temperature of the substrate W falls and the substrate W is cooled. That is, the $sp^2/sp^3$ ratio (ID/IG ratio) continuously increases (increasing regions are formed) in the first step, and the $sp^2/sp^3$ ratio (ID/IG ratio) continuously decreases (decreasing regions are formed) in the second step. The steps are alternately repeated until the carbon film is formed to have a predetermined thickness.

In this case, the temperature of the substrate W is caused to rise using a heater for heating, and the increasing regions of the $sp^2/sp^3$ ratio (ID/IG ratio) can be formed with high continuity by continuously increasing the substrate temperature.

In place of using the heater for heating, it is possible to utilize a natural rise of the substrate temperature at the time of film forming using a tool having low thermal exhaust ability.

On the other hand, the substrate temperature is caused to fall using a dedicated a cooling device, and the decreasing regions of the $sp^2/sp^3$ ratio (ID/IG ratio) can be formed with high continuity by continuously decreasing the substrate temperature.

In place of using the dedicated cooling device, it is possible to cause the substrate temperature to fall by adjusting the exhaust heat rate in accordance with the tool shape.

In addition, film forming may be temporarily halted and the substrate temperature may be caused to fall through natural cooling in a cooling step. In this case, since film forming is temporarily halted and the substrate temperature is caused to fall through natural cooling in the cooling step when the $sp^2/sp^3$ ratio decreases, film forming is performed at substrate temperature that is discontinuously falling between steps before the cooling step and during the cooling step. However, since carbon is likely to achieve the $sp^2$ bonding (graphite structure), even if the substrate temperature falls discontinuously, the $sp^2/sp^3$ ratio does not significantly decrease. The $sp^2/sp^3$ ratio gradually decreases, and discontinuity of the $sp^2/sp^3$ ratio is suppressed.

In this manner, when the method for manufacturing a piston ring according to the present embodiment is applied, even if an ordinary film forming apparatus having no special function is used, a continuous change of the $sp^2/sp^3$ ratio (ID/IG ratio) can be controlled by a very simple control method, that is, controlling the substrate temperature. Therefore, it is possible to easily form a thick carbon film having high continuity of mechanical properties between hard films and soft films and to provide a piston ring having excellent low-friction properties and abrasion resistance.

3. $sp^2/sp^3$ Ratio (ID/IG ratio) of Amorphous Carbon Film

As described above, it is possible to know the film forming circumstances for an amorphous carbon film formed as above, through the $sp^2/sp^3$ ratio or the ID/IG ratio. Therefore, a method for checking for the $sp^2/sp^3$ ratio and the ID/IG ratio in a formed amorphous carbon film will be described below.

(1) Method for Measuring $sp^2/sp^3$ Ratio

The $sp^2/sp^3$ ratio can be obtained by calculating the strength of $sp^2$ and the strength of $sp^3$ using electron energy-loss spectroscopy (EELS) analysis.

Specifically, a spectrum imaging method in a scanning-type TEM (STEM) mode is applied. Under the conditions of 200 kv for the acceleration voltage, $10^{-9}$ Å for the sample absorption current, and ϕ1 nm for the beam spot size, EELS obtained at a pitch of 1 nm is integrated, and a C—K absorption spectrum is extracted as average information from a region of approximately 10 nm, thereby calculating the $sp^2/sp^3$ ratio.

(2) Method for Measuring ID/IG Ratio by Raman Spectroscopy

Due to the time and effort required in the EELS analysis, it is not considered to be easy to calculate the $sp^2/sp^3$ ratio. Therefore, in place of thereof, the ID/IG ratio may be measured by the Raman spectroscopy as described above.

Specifically, as described above, when Raman scattering light is measured with respect to a carbon film using a Raman spectrometer, a D-peak appears near 1,350 $cm^{-1}$ and a G-peak appears near 1,570 $cm^{-1}$. The D-peak is a peak based on a six-membered ring structure of carbon, and the G-peak is a peak based on double bonding of carbon. The ID/IG ratio is calculated from each of the areas ID and IG of peaks. Since the obtained ID/IG ratio has a positive interrelationship with the $sp^2/sp^3$ ratio, it is possible to indirectly know the $sp^2/sp^3$ ratio by obtaining the ID/IG ratio.

EXAMPLES

Hereinafter, based on examples, the present invention will be more specifically described. In the description below, the ID/IG ratio is employed as an index.

Example 1

First, a Ti layer and a Si-containing DLC layer were formed on a substrate as an intermediate layer (adhesion layer) using a cathodic PIG plasma CVD apparatus, and a carbon film layer in which the ID/IG ratio continuously changes was formed on a surface layer thereof.

Film forming in the carbon film layer was performed under the conditions of 0.4 Pa for gas pressure, −500 V for substrate bias voltage, and 5 A for discharge current, and by causing 20 ccm of Ar gas and 80 ccm of $CH_4$ gas to flow. After film forming was performed for 97 minutes, discharging stopped and natural cooling was performed for 90 minutes. After the film forming and cooling were repeated twice, film forming was performed for 97 minutes for the third time, and film forming of the carbon film layer was completed (total thickness of 6.2 μm). In this Example, heating was performed utilizing a natural rise of the substrate temperature at the time of film forming using a tool having low thermal exhaust ability, and cool was performed utilizing natural cooling by dropping discharging.

Figure 2:
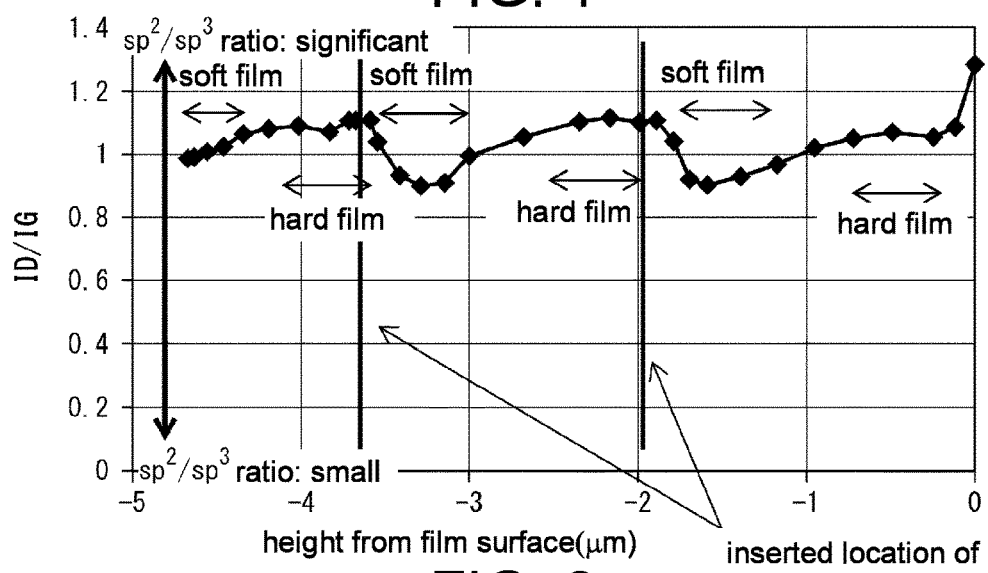
FIG. 2 is a graph illustrating a result of measurements of an ID/IG ratio of an amorphous carbon film in a depth direction in Example 1.

In regard to the formed carbon film layer, FIG. 2 illustrates a measurement result of the ID/IG ratio in the depth direction. In FIG. 2, the vertical axis is the ID/IG ratio and also indicates a relationship with the $sp^2/sp^3$ ratio (also similar in FIG. 3). In addition, the horizontal axis is the depth (unit: μm) and indicates the height from the film surface in a negative value (also similar in FIG. 3).

Figure 3:
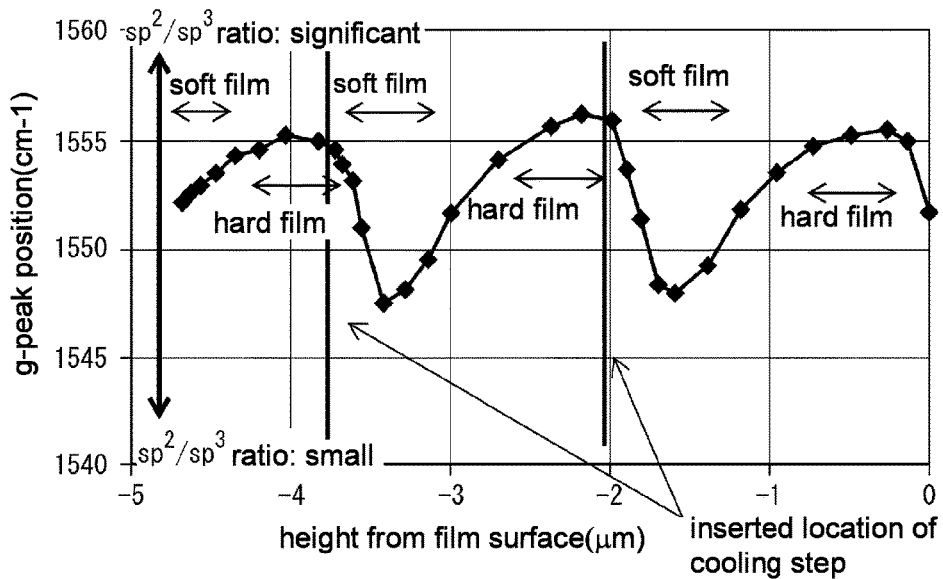
FIG. 3 is a graph illustrating a result of measurements of a G-peak position of the amorphous carbon film in the depth direction in Example 1.
Figure 4:
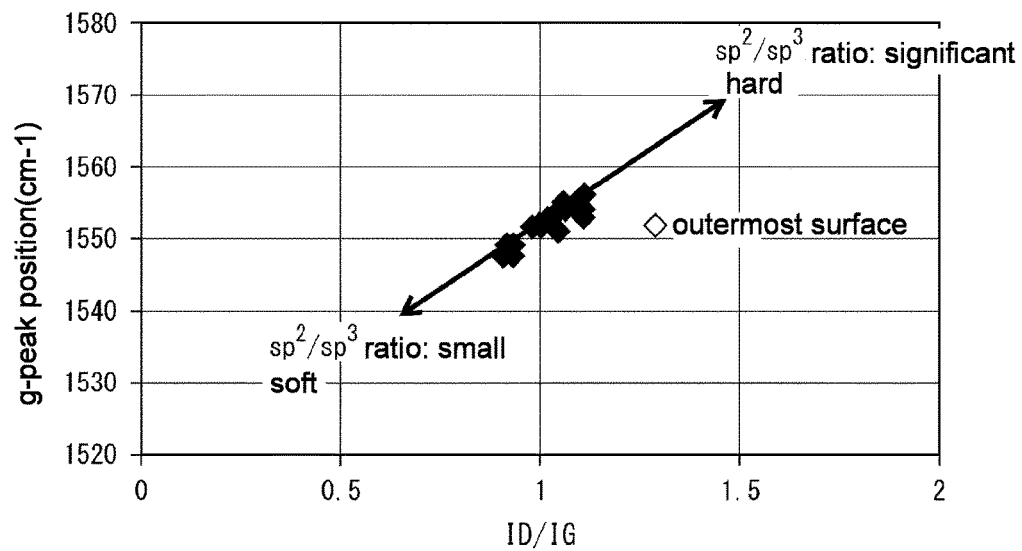
FIG. 4 is a graph illustrating a relationship between the G-peak position and the ID/IG ratio in Example 1.

In addition, FIG. 3 illustrates a relationship between the depth (horizontal axis) and the G-peak position (vertical axis), and FIG. 4 illustrates a relationship between the ID/IG ratio (horizontal axis) and the G-peak position (vertical axis).

From FIG. 2, it is ascertained that the ID/IG ratio continuously changes from the substrate toward the film surface, and the ID/IG ratio continuously rises as film forming proceeds but the ID/IG ratio continuously falls for a while after the cooling step is inserted. It is ascertained that three hard films and three soft films are alternately formed in accordance with the ID/IG ratio repetitively rising and falling.

Similarly, from FIG. 3, it is ascertained that high-wavenumber shift regions in which the G-peak position shifts to a high wavenumber and low-wavenumber shift regions in which the G-peak position shifts to a low wavenumber are alternately formed, and three hard films and three soft films are alternately formed.

From FIG. 4, it is ascertained that there is a positive interrelationship between the shifts of the ID/IG ratio and the G-peak position.

In this manner, the hard films and the soft films are alternately formed due to the following reason. When the substrate temperature keeps on rising, graphitization proceeds (the amount of hydrogen decreases) and a hard film is formed. On the other hand, when the substrate temperature falls, graphitization is suppressed (the amount of hydrogen increases) and the surface layer returns to a soft film which is the original film properties. If the soft film is formed once, the soft film does not change in quality to the hard film unless the temperature becomes higher. Therefore, there is no change in quality at the maximum substrate temperature of 230° C. when forming a hard film in this Example, thereby realizing a structure in which the hard films and the soft films are alternately formed in order through film forming performed by repeating rising and falling of the substrate temperature. However, since such an orderly structure cannot be formed when the maximum temperature at the time of forming a hard film reaches the temperature at which a soft film changes in quality, there is a need to be cautious.

Example 2

First, a Ti layer and a Si-containing DLC layer were formed on a substrate as an intermediate layer (adhesion layer) using a cathodic PIG plasma CVD apparatus having a size larger than the apparatus used in Example 1, and a carbon film layer in which the ID/IG ratio continuously changes was formed on a surface layer thereof.

Film forming in the carbon film layer was performed under the conditions of 0.4 Pa for gas pressure, −500 V for substrate bias voltage, and 10 A for discharge current, and by causing 40 ccm of Ar gas, and 150 ccm of $C_2H_2$ gas to flow. After film forming was performed for 77 minutes, discharging stopped and natural cooling was performed for 30 minutes. After the film forming and cooling were repeated twice, film forming was performed for 28 minutes for the third time, and film forming of the carbon film layer was completed (total thickness of 9.6 μm). In this Example as well, heating was performed utilizing a natural rise of the substrate temperature at the tune of film forming using a tool having low thermal exhaust ability, and cool was performed utilizing natural cooling by dropping discharging.

Figure 5:
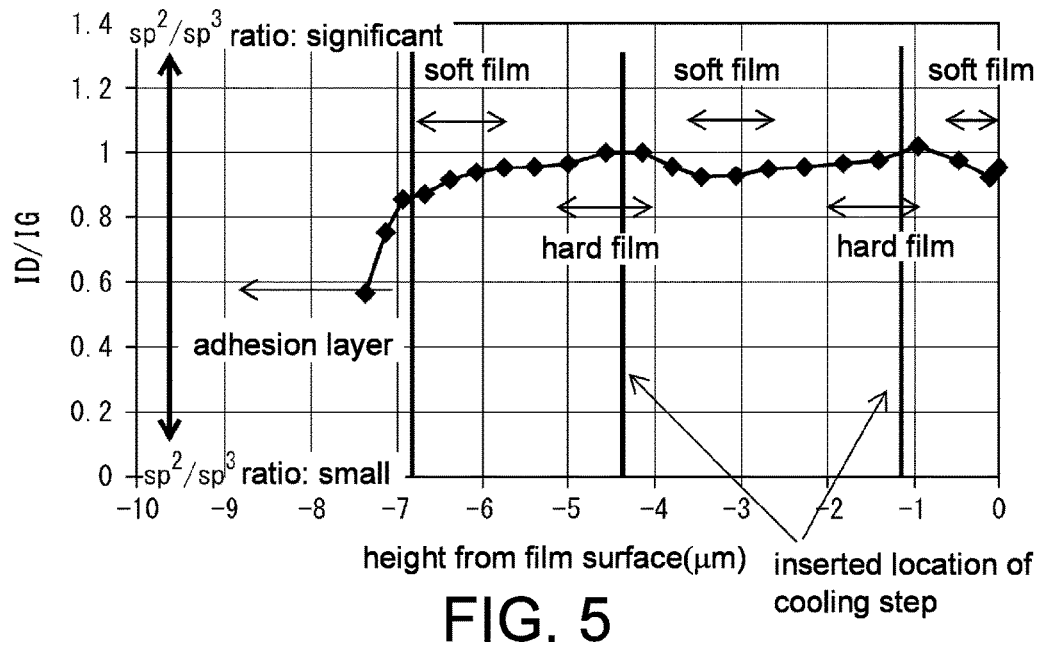
FIG. 5 is a graph illustrating a result of measurements of the ID/IG ratio of the amorphous carbon film in the depth direction in Example 2.

In regard to the formed carbon film layer, FIG. 5 illustrates a measurement result of the ID/IG ratio in the depth direction. In FIG. 5, the vertical axis is the ID/IG ratio and also indicates a relationship with the $sp^2/sp^3$ ratio (also similar in FIG. 6). In addition, the horizontal axis is the depth (unit: μm) and indicates the height from the film surface in a negative value (also similar in FIG. 6).

Figure 6:
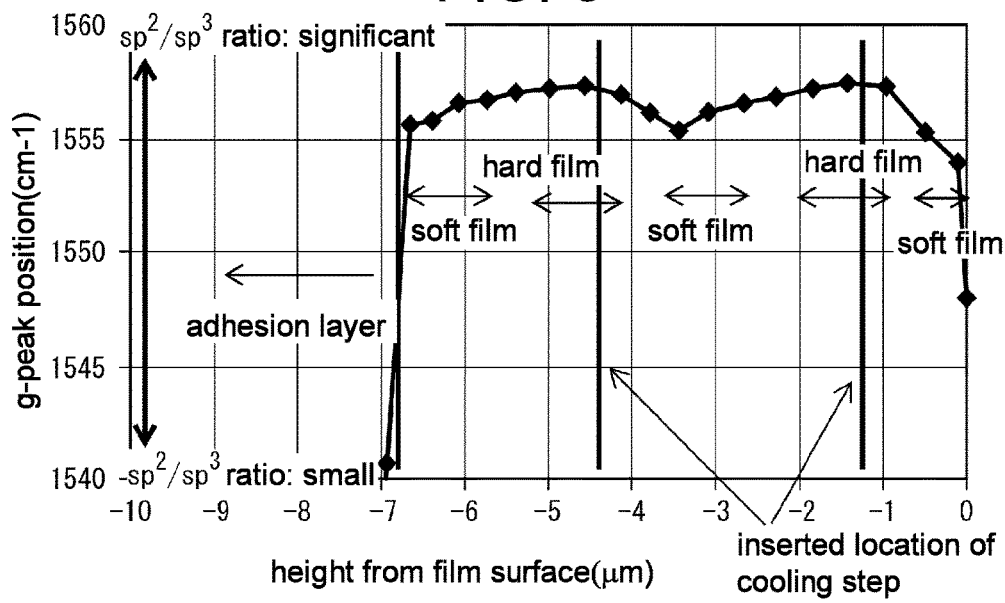
FIG. 6 is a graph illustrating a result of measurements of the G-peak position of the amorphous carbon film in the depth direction in Example 2.
Figure 7:
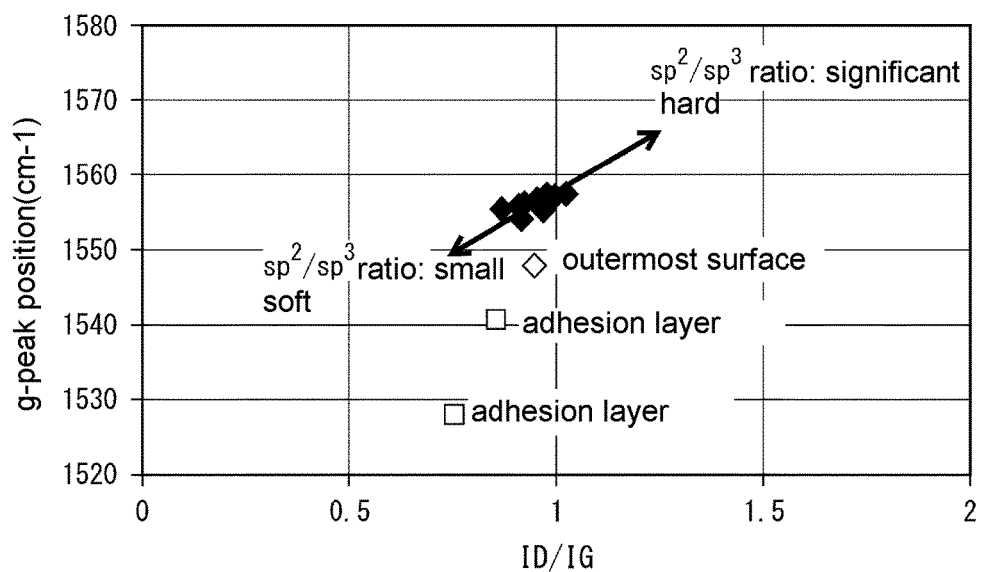
FIG. 7 is a graph illustrating a relationship between the G-peak position and the ID/IG ratio in Example 2.

In addition, FIG. 6 illustrates a relationship between the depth (horizontal axis) and the G-peak position (vertical axis), and FIG. 7 illustrates a relationship between the ID/IG ratio (horizontal axis) and the G-peak position (vertical axis).

From FIGS. 5 to 7, it is ascertained that this Example is also similar to Example 1.

That is, from FIG. 5, it is ascertained that the ID/IG ratio continuously changes from the substrate toward the film surface, and the ID/IG ratio continuously rises as film forming proceeds but the ID/IG ratio continuously falls for a while after the cooling step is inserted. It is ascertained that two hard films and three soft films are alternately formed in accordance with the ID/IG ratio repetitively rising and falling.

Similarly, from FIG. 6, it is ascertained that high-wavenumber shift regions in which the G-peak position shifts to a high wavenumber and low-wavenumber shift regions in which the G-peak position shifts to a low wavenumber are alternately formed, two hard films and three soft films are alternately formed.

From FIG. 7, it is ascertained that there is a positive interrelationship between the shifts of the ID/IG ratio and the G-peak position.

In this manner, similar to the case of Example 1, the hard films and the soft films are alternately formed due to the following reason. When the substrate temperature keeps on rising, graphitization proceeds (the amount of hydrogen decreases) and a hard film is formed. On the other hand, when the substrate temperature falls, graphitization is suppressed (the amount of hydrogen increases) and the surface layer returns to a soft film which is the original film properties. If the soft film is formed once, the soft film does not change in quality to the hard film unless the temperature becomes higher. Therefore, there is no change in quality at the maximum substrate temperature of 210° C. when forming a hard film in this Example, thereby realizing a structure in which the hard films and the soft films are alternately formed in order through film forming performed by repeating rising and falling of the substrate temperature. However, since such an orderly structure cannot be formed when the maximum temperature at the time of forming a hard film reaches the temperature at which a soft film changes in quality, there is a need to be cautious.

Hereinabove, the present invention has been described based on the embodiment. However, the present invention is not limited to the embodiment. It is possible to add various changes with respect to the embodiment within the same range as the present invention and a range equivalent thereto.

What is claimed is:

1. A piston ring, comprising:
   a ring-shaped substrate; and
   an amorphous carbon film, coated on a surface of the ring-shaped substrate,
   wherein the amorphous carbon film is formed using a CVD method, and
   increasing regions in which an $sp^2/sp^3$ ratio that is a ratio of $sp^2$ bonding to $sp^a$ bonding continuously increases and decreasing regions in which the $sp^2/sp^3$ ratio continuously decreases are alternately formed from the substrate surface toward a film surface, and the $sp^2/sp^3$ ratio continuously changes on borders between the increasing regions and the decreasing regions so that soft films having a low $sp^2/sp^3$ ratio and hard films having a high $sp^2/sp^3$ ratio are formed in an alternately layered manner; and
   the decreasing regions are configured to be equal in number to or one region fewer than the increasing regions.

2. The piston ring according to claim 1, wherein hydrogen content in the amorphous carbon film is equal to or more than 5 atom % in a location having the lowest $sp^2/sp^3$ ratio.

3. The piston ring according to claim 2, wherein the amorphous carbon film is formed on an outer circumferential sliding surface and upper and lower surfaces of the substrate.

4. The piston ring according to claim 1, wherein the amorphous carbon film is formed on an outer circumferential sliding surface and upper and lower surfaces of the substrate.

5. A method for manufacturing a piston ring, in which the piston ring according to claim 1 is manufactured using a CVD method, the method comprising:
   forming an amorphous carbon film on a substrate by alternately providing a first step of forming a film under a condition in which a temperature of the substrate rises and a second step of forming a film under a condition in which the temperature of the substrate falls.

6. The method for manufacturing a piston ring according to claim 5, wherein the CVD method is performed using a plasma CVD apparatus.

7. The method for manufacturing a piston ring according to claim 6, wherein the plasma CVD apparatus is a PIG plasma CVD apparatus.

8. The method for manufacturing a piston ring according to claim 5, wherein the amorphous carbon film having distribution of different $sp^2/sp^3$ ratios is formed with respect to each substrate at the same time by causing each of a plurality of substrates to have a difference in thermal exhaust ability in the CVD method.

9. The method for manufacturing a piston ring according to claim 5, wherein the amorphous carbon film having distribution of different $sp^2/sp^3$ ratios inside the substrate is formed at the same time by causing the substrate to internally have a difference in thermal exhaust ability in the CVD method.

10. A piston ring, comprising:
    a ring-shaped substrate; and
    an amorphous carbon film, coated on a surface of the ring-shaped substrate,
    wherein the amorphous carbon film is formed using a CVD method, and
    an ID/IG ratio that is a ratio of a peak area in a D-peak position to a peak area in a G-peak position of a Raman spectrum continuously changes such that high-wavenumber shift regions in which the G-peak position shifts to a high wavenumber and low-wavenumber shift regions in which the G-peak position shifts to a low wavenumber are alternately formed from the substrate surface toward a film surface, and the ID/IG ratio continuously changes on borders between the high-wavenumber shift regions and the low-wavenumber shift regions so that soft films having a low ID/IG ratio and hard films having a high ID/IG ratio are formed in an alternately layered manner; and
    the low-wavenumber shift regions are configured to be equal in number to or one region fewer than the high-wavenumber shift regions.

11. The piston ring according to claim 10, wherein hydrogen content in the amorphous carbon film is equal to or more than 5 atom % in a location having the lowest ID/IG ratio.

12. The piston ring according to claim 11, wherein the amorphous carbon film is formed on an outer circumferential sliding surface and upper and lower surfaces of the substrate.

13. The piston ring according to claim 10, wherein the amorphous carbon film is formed on an outer circumferential sliding surface and upper and lower surfaces of the substrate.

14. A method for manufacturing a piston ring, in which the piston ring according to claim 10 is manufactured using a CVD method, the method comprising:
    forming an amorphous carbon film on a substrate by alternately providing a first step of forming a film under a condition in which a temperature of the substrate rises and a second step of forming a film under a condition in which the temperature of the substrate falls.

* * * * *